US012593696B2

(12) United States Patent (10) Patent No.: US 12,593,696 B2
Ha et al. (45) Date of Patent: Mar. 31, 2026

(54) CHIP ON FILM PACKAGE AND DISPLAY DEVICE INCLUDING THE SAME

(71) Applicant: LX SEMICON CO., LTD., Daejeon (KR)

(72) Inventors: Dam Ha, Daejeon (KR); Kyung Hyun Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 623 days.

(21) Appl. No.: 17/957,012

(22) Filed: Sep. 30, 2022

(65) Prior Publication Data

US 2023/0119961 A1 Apr. 20, 2023

(30) Foreign Application Priority Data

Oct. 18, 2021 (KR) ........................ 10-2021-0138188

(51) Int. Cl.
*H01L 23/552* (2006.01)
*H01L 23/00* (2006.01)
*H01L 23/31* (2006.01)
*H01L 23/498* (2006.01)

(52) U.S. Cl.
CPC ........ *H01L 23/552* (2013.01); *H01L 23/3121* (2013.01); *H01L 23/3135* (2013.01); *H01L 23/3142* (2013.01); *H01L 24/16* (2013.01); *H01L 23/49838* (2013.01); *H01L 23/4985* (2013.01); *H01L 2224/16225* (2013.01)

(58) Field of Classification Search
CPC ... H01L 23/552; H01L 23/562; H01L 23/564;
H01L 23/3142; H01L 23/3737; H01L
23/5389; H01L 23/3675; H01L
2225/1094; G06F 1/20
See application file for complete search history.

(56) References Cited

U.S. PATENT DOCUMENTS

| | | | | |
|---|---|---|---|---|
| 10,770,368 B2 * | 9/2020 | Huang | .............. | H01L 23/49572 |
| 2008/0023822 A1 * | 1/2008 | Lee | ................... | H01L 23/49838 |
| | | | | 257/E23.005 |
| 2012/0241942 A1 * | 9/2012 | Ihara | ...................... | H01L 24/73 |
| | | | | 438/122 |
| 2014/0300004 A1 * | 10/2014 | Choi | ..................... | H01L 21/561 |
| | | | | 257/774 |

(Continued)

FOREIGN PATENT DOCUMENTS

| | | |
|---|---|---|
| KR | 10-2010-0135161 A | 12/2010 |
| KR | 10-1585756 B1 | 1/2016 |

(Continued)

*Primary Examiner* — Lawrence C Tynes, Jr.
(74) *Attorney, Agent, or Firm* — ROTHWELL, FIGG, ERNST & MANBECK, P.C.

(57) ABSTRACT

A chip on film package according to one embodiment of the present disclosure includes: a base film; a wiring unit located on the base film; a semiconductor chip mounted on the wiring unit; a first heat dissipation unit configured to come into contact with the semiconductor chip; a second heat dissipation unit configured to come into contact with the first heat dissipation unit, and comprise a metal; and an adhesive unit configured to attach the base film on which the wiring unit is located and the semiconductor chip is mounted to the second heat dissipation unit with the first heat dissipation unit therebetween.

19 Claims, 5 Drawing Sheets

(56)  References Cited

U.S. PATENT DOCUMENTS

2018/0342437 A1* 11/2018 Huang .................. H01L 23/367
2021/0318730 A1* 10/2021 Lee ...................... H01Q 21/061
2022/0359228 A1* 11/2022 Kuo ................... H01L 23/5385

FOREIGN PATENT DOCUMENTS

KR      10-2016-0063495 A      6/2016
KR      10-2018-0121058 A      11/2018

* cited by examiner

CHIP ON FILM PACKAGE AND DISPLAY DEVICE INCLUDING THE SAME

CROSS-REFERENCE TO RELATED APPLICATIONS

This application claims the benefit of the Korean Patent Applications No. 10-2021-0138188 filed on Oct. 18, 2021, which are hereby incorporated by reference as if fully set forth herein.

FIELD OF THE INVENTION

The specification relates to a chip on film package and a display device including the same.

BACKGROUND

Recently, with the development of flat panel display industry such as a liquid crystal display (LCD), the manufacturing industry of a tape package, which is a drive IC component of a flat panel display, has also been developed. This tape package is a semiconductor package using a base film, and can be classified into a tape carrier package (TCP) and a chip on film (COF) package.

Generally, the tape package uses a TAB method of using an input/output wiring pattern formed on a base film as an external connection terminal, and the input/output wiring pattern is directly attached to and mounted on a printed circuit board (PCB) or a display panel.

A tape package attached to or mounted on the printed circuit board (PCB) or the display panel can be damaged by an external impact such as interference from an external device or in a subsequent process and is vulnerable to electromagnetic interference (EMI). Further, a malfunction of a semiconductor chip can occur due to heat generated as the semiconductor chip of the tape package is driven.

SUMMARY

The present disclosure is directed to providing a chip on film package for not only shielding electromagnetic interference (EMI) and preventing damage to a semiconductor chip by an external impact, but also effectively dissipating heat generated from the semiconductor chip mounted on a chip on film package to prevent a malfunction of the semiconductor chip by heat generation, and a display device including the same.

A chip on film package according to one embodiment of the present disclosure includes: a base film; a wiring unit located on the base film; a semiconductor chip mounted on the wiring unit; a first heat dissipation unit configured to come into contact with the semiconductor chip; a second heat dissipation unit configured to come into contact with the first heat dissipation unit, and comprise a metal; and an adhesive unit configured to attach the base film on which the wiring unit is located and the semiconductor chip is mounted to the second heat dissipation unit with the first heat dissipation unit therebetween.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
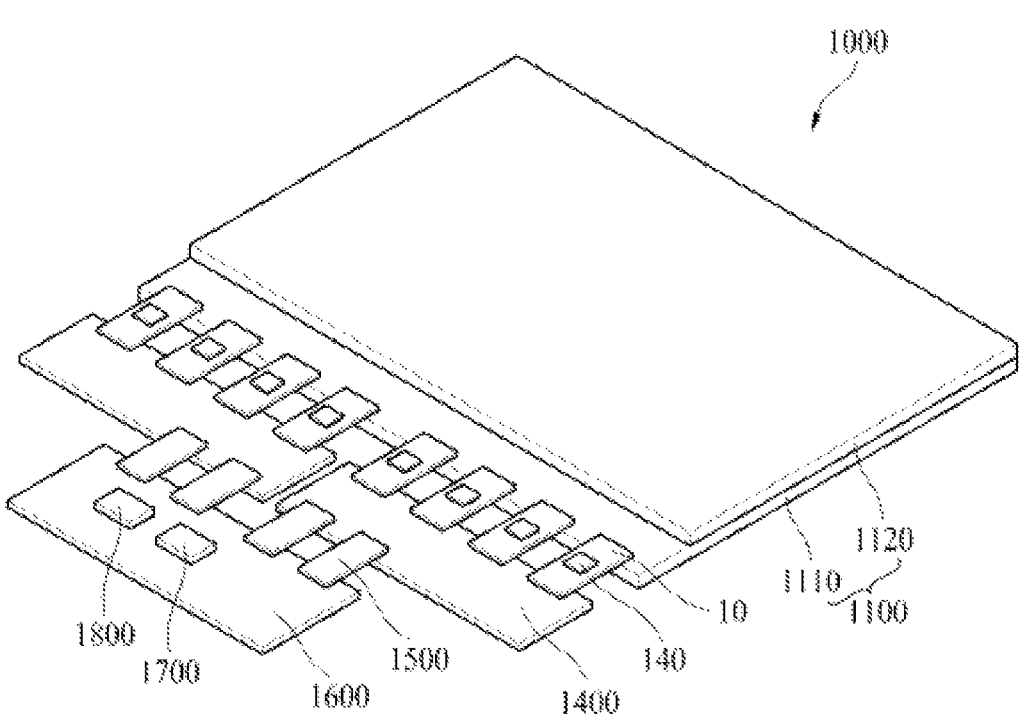
FIG. 1 is a perspective view of a display device including a chip on film package according to one embodiment of the present disclosure.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to one embodiment of the present disclosure will be described with reference to FIG. 1. FIG. 1 is a perspective view illustrating the display device according to one embodiment of the present disclosure.

Referring to FIG. 1, the display device according to one embodiment of the present disclosure includes a display panel 1100, semiconductor chips 140, chip on film packages 10, a source circuit board 1400, flexible cables 1500, a control circuit board 1600, a timing controller 1700, and a voltage supply unit 1800.

The display panel 1100 may include a lower substrate 1110 and an upper substrate 1120. The lower substrate 1110 may comprise a glass substrate or a plastic film, and the upper substrate 1120 may comprise a glass substrate, a plastic film, an encapsulation film, or a barrier film.

The display panel 1100 includes a display region and a non-display region provided around the display region. The display region is a region where pixels display an image. The display panel 1100 includes data lines and scan lines which intersect each other, and each of the pixels may be connected to any one of the data lines and any one of the scan lines. The display panel 1100 may be implemented as a liquid crystal display panel or an organic light-emitting display panel.

The semiconductor chips 140 may be respectively mounted on the chip on film packages 10. Each chip on film package 10 will be described below in detail with reference to FIGS. 2 to 5. Each chip on film package 10 may be attached onto the lower substrate 1110 by a tape automated bonding (TAB) method using an anisotropic conductive film, and accordingly, the semiconductor chips 140 may be respectively connected to the data lines of the display panel 1100.

The semiconductor chips 140 supply data voltages to the data lines, respectively. Each semiconductor chip 140 receives digital video data and a data timing control signal from the timing controller 1700. The semiconductor chips 140 convert the digital video data to the data voltages according to the data timing control signal and applies the data voltages to the data lines, respectively.

The display panel 1100 may include a scan driver connected to the scan lines to apply scan signals. The scan driver generates the scan signals according to a scan timing control signal input from the timing controller 1700 and applies the scan signals to the scan lines. In this case, the scan driver may be disposed in the non-display region of the display panel 1100 in a gate driver in panel (GIP) method by including a plurality of transistors. Alternatively, the scan driver may be disposed in a shape of a semiconductor chip and mounted on a gate flexible film attached to the lower substrate 1110 of the display panel 1100.

The source circuit board 1400 may include first connectors (not shown) to be connected to the flexible cables 1500. The source circuit board 1400 may be connected to the flexible cables 1500 through the first connectors. The source circuit board 1400 may be a printed circuit board such as a flexible printed circuit board.

The control circuit board 1600 may be a printed circuit board such as a flexible printed circuit board. The control circuit board 1600 may include second connectors (not shown) to be connected to the flexible cables 1500. The control circuit board 1600 may be connected to the flexible cables 1500 through the second connectors. However, embodiments according to the present disclosure are not limited thereto.

The timing controller 1700 receives digital video data and timing signals from an external system on chip. The timing signals may include a vertical sync signal, a horizontal sync signal, a data enable signal, and a clock.

The timing controller 1700 generates control signals for controlling operation timings of the semiconductor chips 140 and the scan driver. The control signals include the data timing control signal for controlling the operation timing of the semiconductor chips 140 and the scan timing control signal for controlling the operation timing of the scan driver. The timing controller 1700 supplies the data timing control signal and the digital video data to the semiconductor chips 140, and supplies the scan timing control signal to the scan driver.

The voltage supply unit 1800 generates various driving voltages from main power applied from the outside and supplies the driving voltages to the display panel 1100, the scan driver, and the semiconductor chips 140.

The timing controller 1700 and the voltage supply unit 1800 may be mounted on the control circuit board 1600. In this case, the timing controller 1700 and the voltage supply unit 1800 may be the shape of semiconductor chips.

Figure 2:
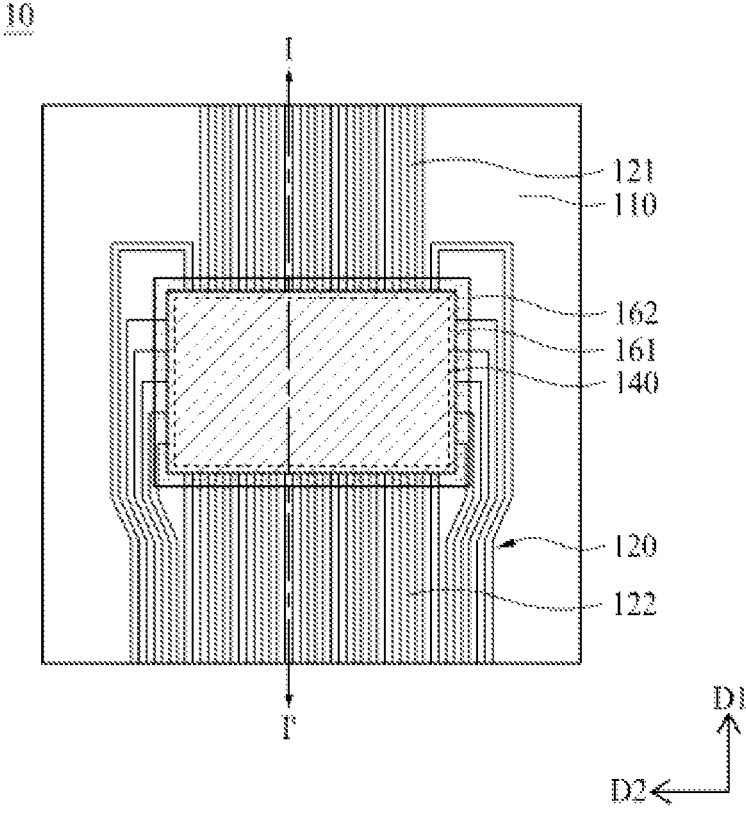
FIG. 2 is a plan view of the chip on film package according to one embodiment of the present disclosure.

Hereinafter, the chip on film package according to one embodiment of the present disclosure will be described in detail with reference to FIGS. 2 and 3. FIG. 2 is a plan view of the chip on film package according to one embodiment of the present disclosure, and FIG. 3 is a cross-sectional view taken along line I-I' of FIG. 2 and a plan view of a second heat dissipation unit according to one embodiment of the present disclosure.

Referring to FIG. 2, the chip on film package 10 according to one embodiment of the present disclosure may include a base film 110, a wiring unit 120, bumps 130, the semiconductor chip 140, a first heat dissipation unit 161, a potting resin unit 170, a second heat dissipation unit 162, an adhesive unit 180, and a second protection unit 190.

The base film 110 may comprise a plastic film. For example, the base film 110 may be a sheet or film including a cellulose resin such as triacetyl cellulose (TAC), diacetyl cellulose (DAC), or the like, a cyclo olefin polymer (COP) or cyclo olefin copolymer (COC) such as norbornene derivatives or the like, an acrylic resin such as poly(methylmethacrylate) (PMMA), or the like, a polyolefin such as polycarbonate (PC), polyethylene (PE), polypropylene (PP), or the like, polyvinyl alcohol (PVA), poly ether sulfone (PES), polyetheretherketone (PEEK), polyetherimide (PEI), polyethylene naphthalate (PEN), polyethylene terephthalate (PET), polyimide (PI), polysulfone (PSF), a fluoride resin, or the like, but is not limited thereto.

Figure 3:
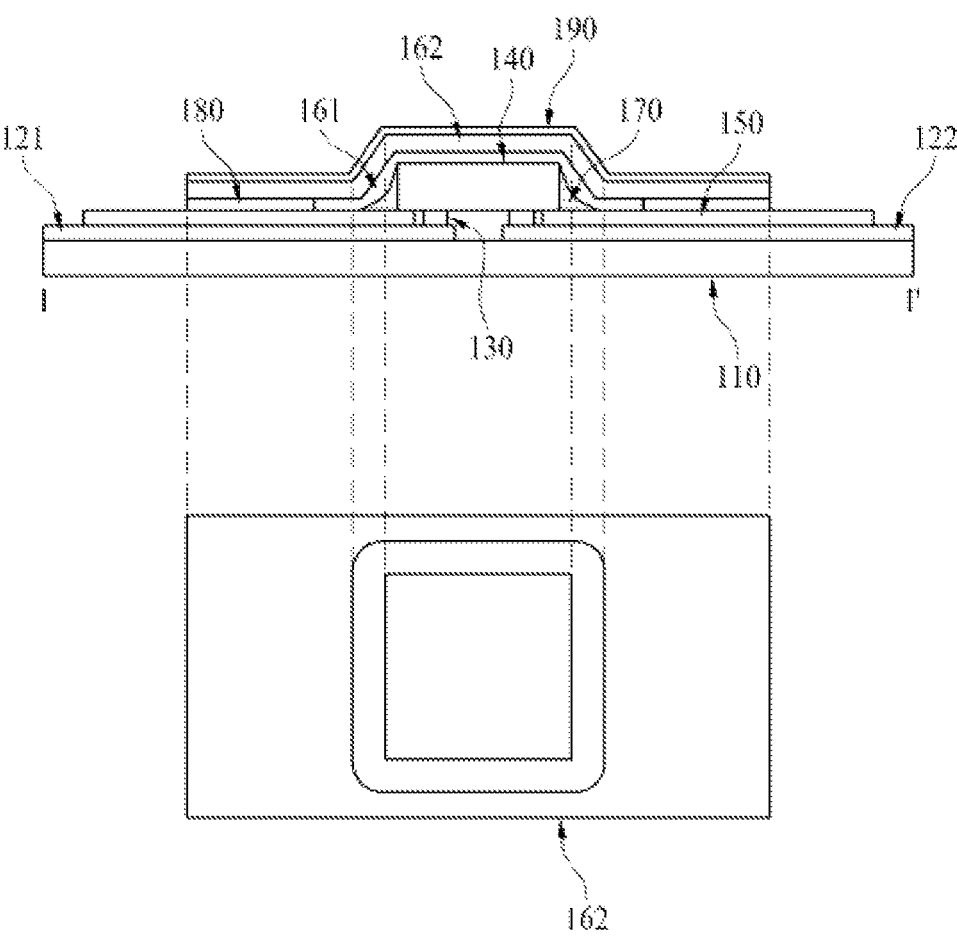
FIG. 3 is a cross-sectional view taken along line I-I' of FIG. 2 and a plan view of a second heat dissipation unit according to one embodiment of the present disclosure.

As shown in FIGS. 2 and 3, the wiring unit 120 may be disposed on the base film 110 along a first direction D1. The wiring unit 120 may include a plurality of input wirings 121 and a plurality of output wirings 122.

The wiring unit 120 may be formed by attaching a metal thin film onto a surface of the base film 110 by an electrodeposition process or a thermocompression bonding process, and then using photolithography and etching processes. For example, the wiring unit 120 may comprise copper (Cu), gold (Au), tin (Sn), lead (Pb), silver (Ag), nickel (Ni), or the like. However, a method of forming the wiring unit 120 is not limited thereto.

The semiconductor chip 140 is mounted on the wiring unit 120 through the bumps 130. That is, the semiconductor chip 140 is located on the base film 110 and the wiring unit 120 and is electrically connected to the wiring unit 120. In this case, the bumps 130 may be bonded and connected to the wiring unit 120 disposed on the base film 110 using tape automated bonding (TAB) technology. Accordingly, the semiconductor chip 140 generates a data voltage according to an input signal received through the input wirings 121 and outputs the data voltage through the output wirings 122.

A first protection unit 150 may be located to overlap the wiring unit 120 and the semiconductor chip 140. Specifically, the first protection unit 150 may be located to overlap at least a portion of the wiring unit 120 and at least a portion of the semiconductor chip 140. Specifically, the first protection unit 150 is located to overlap an edge of the semiconductor chip 140, and has a predetermined thickness capable of supporting the semiconductor chip 140. For example, the first protection unit 150 has the same thickness as the bumps 130.

Further, the first protection unit 150 may comprise a surface insulating material (Surface Resist, SR). Accordingly, the first protection unit 150 may be insulated from the outside, and may protect the wiring unit 120 from external moisture or dust.

The first heat dissipation unit 161 may be located to overlap the semiconductor chip 140. Specifically, the first heat dissipation unit 161 may cover the semiconductor chip 140. In particular, since the first heat dissipation unit 161 comes into contact with the semiconductor chip 140 and the second heat dissipation unit 162 to be described below between the semiconductor chip 140 and the second heat dissipation unit 162, and has a larger area than the semiconductor chip 140 in a plan view, the first heat dissipation unit 161 may effectively dissipate heat generated from the semiconductor chip 140 to the second heat dissipation unit 162.

Further, the first heat dissipation unit 161 may include a thermal interface material (TIM). Accordingly, the heat generated from the semiconductor chip 140 may be effectively diffused to the first heat dissipation unit 161 and dissipated.

The potting resin unit 170 fills a space between a side surface of the semiconductor chip 140 and the first heat dissipation unit 161. Specifically, as shown in FIG. 3, the potting resin unit 170 fills a space between at least a portion of the wiring unit 120 and the semiconductor chip 140 at a space between the first protection unit 150, the side surface of the semiconductor chip 140, and the first heat dissipation unit 161. For example, the potting resin unit 170 may be formed by filling a potting resin in a space defined by the base film 110 and the wiring unit 120, the side surface of the semiconductor chip 140, and the first heat dissipation unit 161 by a potting process. Accordingly, the potting resin unit 170 may protect the semiconductor chip 140 from external moisture and dust.

Further, the potting resin unit 170 may fix the semiconductor chip 140 at a predetermined position on the base film 110 and the wiring unit 120. Accordingly, the potting resin unit 170 may prevent defects caused by the movement of the wiring unit 120 and the semiconductor chip 140 which may occur due to a physical impact.

The second heat dissipation unit 162 may be located to overlap the semiconductor chip 140 and the first heat dissipation unit 161. Specifically, the second heat dissipation unit 162 may cover the semiconductor chip 140 and the first heat dissipation unit 161. In particular, since the second heat dissipation unit 162 comes into contact with the first heat dissipation unit 161 on the first heat dissipation unit 161 and has a larger area than the first heat dissipation unit 161 in a plan view, the second heat dissipation unit 162 may effectively dissipate the heat generated from the semiconductor chip 140 and diffused through the first heat dissipation unit 161 to the outside.

According to one embodiment of the present disclosure, as shown in FIGS. 2 and 3, the second heat dissipation unit 162 may be attached to overlap at least portions of the input wirings 121 and the output wirings 122. Specifically, the second heat dissipation unit 162 may be attached to the base film 110 and the wiring unit 120 by the adhesive unit 180 located to surround the semiconductor chip 140 in a plan view to cover the first heat dissipation unit 161.

The second heat dissipation unit 162 may comprise a metal. Accordingly, the second heat dissipation unit 162 may protect the semiconductor chip 140 and the wiring unit 120 from physical interference by an external device, and may shield electromagnetic interference (EMI) to protect the semiconductor chip 140.

The second heat dissipation unit 162 may have a shape corresponding to the semiconductor chip 140 mounted on the base film 110 and the wiring unit 120. Specifically, as shown in FIG. 3, the second heat dissipation unit 162 may have a shape corresponding to the shape in which the base film 110, the wiring unit 120, the semiconductor chip 140 mounted on the wiring unit 120, the first protection unit 150 which supports the semiconductor chip 140, the first heat dissipation unit 161 which covers the semiconductor chip 140, and the potting resin unit 170 are stacked. Accordingly, the second heat dissipation unit 162 may protect the wiring unit 120 and the semiconductor chip 140 with a minimum volume.

As described above, the adhesive unit 180 attaches and fixes the second heat dissipation unit 162 to the first protection unit 150 located on the base film 110 and the wiring unit 120 in the shape of surrounding the semiconductor chip 140 and the first heat dissipation unit 161 which covers the semiconductor chip 140 in a plan view. Accordingly, the adhesive unit 180 may protect the semiconductor chip 140 from the external moisture or dust which passes through a space between the base film 110, the wiring unit 120, and the second heat dissipation unit 162.

The second protection unit 190 may comprise an insulating material to insulate the semiconductor chip 140, the wiring unit 120, the bumps 130, and the second heat dissipation unit 162 from the outside. For example, the second protection unit 190 may comprise an insulating resin having a predetermined strength to protect the second heat dissipation unit 162 from an external impact. Further, the second protection unit 190 may comprise a material having high thermal conductivity to effectively dissipate heat diffused to the second heat dissipation unit 162.

Figure 4:
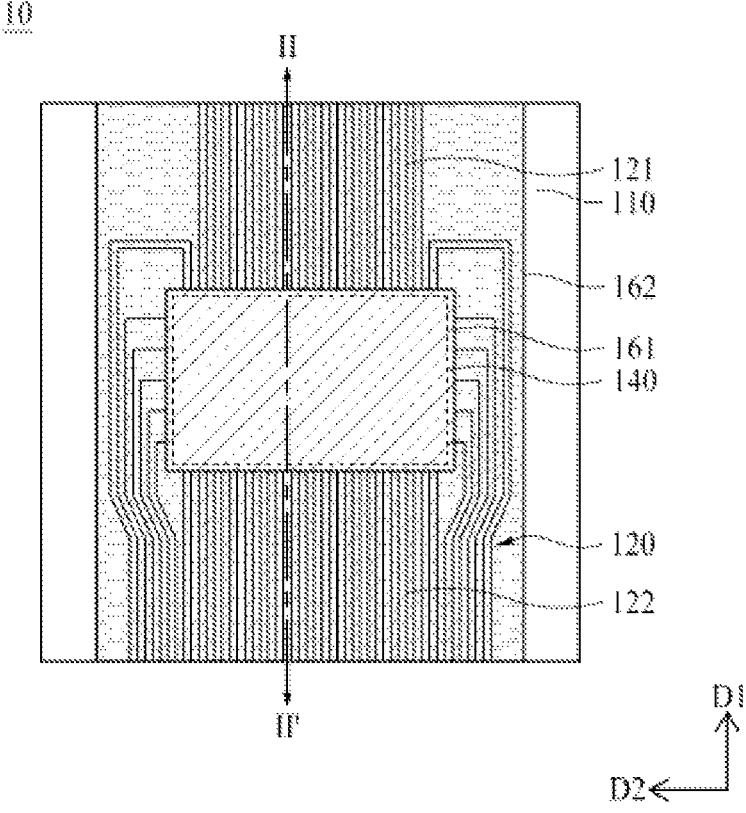
FIG. 4 is a plan view of a chip on film package according to another embodiment of the present disclosure.
Figure 5:
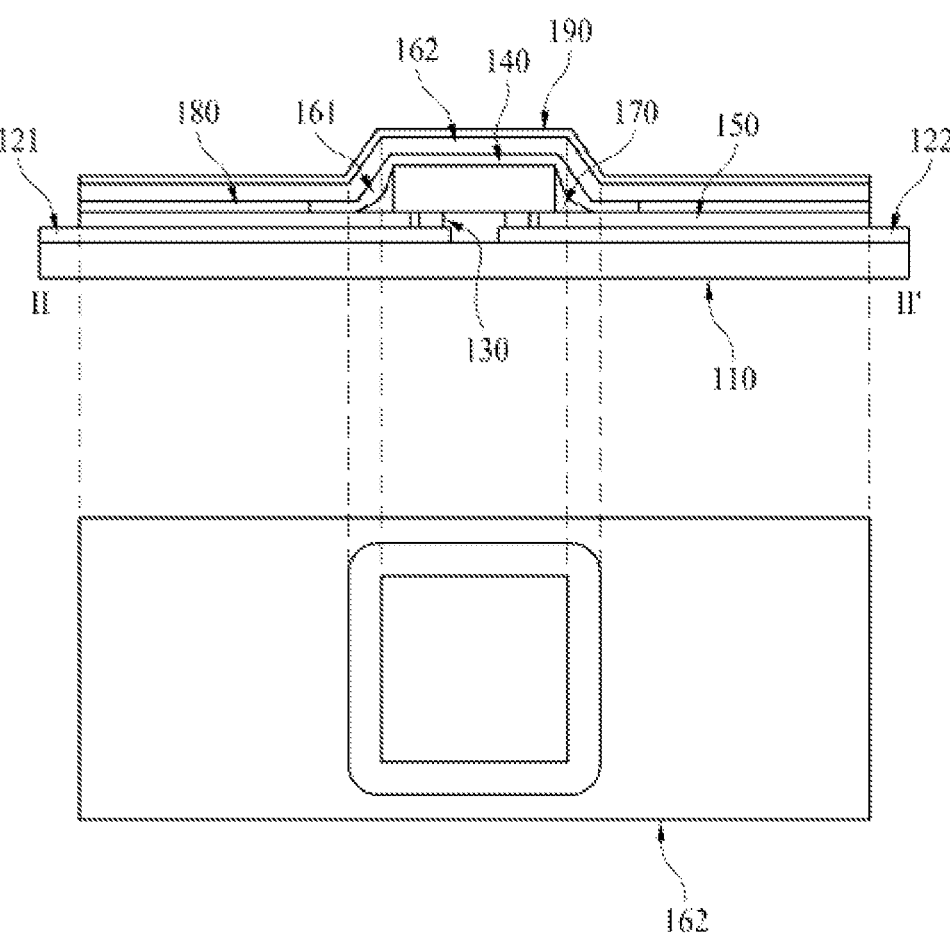
FIG. 5 is a cross-sectional view taken along line II-II' of FIG. 4 and a plan view of a second heat dissipation unit according to another embodiment of the present disclosure.

Hereinafter, a chip on film package according to another embodiment of the present disclosure will be described in detail with reference to FIGS. 4 and 5. FIG. 4 is a plan view of the chip on film package according to another embodiment of the present disclosure. FIG. 5 is a cross-sectional view taken along line II-II' of FIG. 4 and a plan view of a second heat dissipation unit according to another embodiment of the present disclosure.

Referring to FIG. 4, a chip on film package 10 according to one embodiment of the present disclosure may include a base film 110, a wiring unit 120, bumps 130, a semiconductor chip 140, a first heat dissipation unit 161, a potting resin unit 170, a second heat dissipation unit 162, an adhesive unit 180, and a second protection unit 190.

The first heat dissipation unit 161 may be located to overlap the semiconductor chip 140. Specifically, the first heat dissipation unit 161 may cover the semiconductor chip 140. In particular, since the first heat dissipation unit 161 comes into contact with the semiconductor chip 140 and the second heat dissipation unit 162 to be described below between the semiconductor chip 140 and the second heat dissipation unit 162, and has a larger area than the semiconductor chip 140 in a plan view, the first heat dissipation unit 161 may effectively dissipate heat generated from the semiconductor chip 140 to the second heat dissipation unit 162.

Further, the first heat dissipation unit 161 may include a thermal interface material (TIM). Accordingly, the heat generated from the semiconductor chip 140 may be effectively diffused to the first heat dissipation unit 161 and dissipated.

The potting resin unit 170 fills a space between a side surface of the semiconductor chip 140 and the first heat dissipation unit 161. Specifically, as shown in FIG. 5, the potting resin unit 170 fills a space between at least a portion of the wiring unit 120 and the semiconductor chip 140 at a space between the first protection unit 150, the side surface of the semiconductor chip 140, and the first heat dissipation unit 161. For example, the potting resin unit 170 may be formed by filling a potting resin in a space defined by the base film 110 and the wiring unit 120, the side surface of the semiconductor chip 140, and the first heat dissipation unit 161 by a potting process. Accordingly, the potting resin unit 170 may protect the semiconductor chip 140 from external moisture and dust.

Further, the potting resin unit 170 may fix the semiconductor chip 140 at a predetermined position on the base film 110 and the wiring unit 120. Accordingly, the potting resin unit 170 may prevent defects caused by the movement of the wiring unit 120 and the semiconductor chip 140 which may occur due to a physical impact. As shown in FIG. 4, the second heat dissipation unit 162 may have a larger area than the semiconductor chip 140, and may overlap the entire semiconductor chip 140 and the entire first heat dissipation unit 161 in a plan view. Further, the second heat dissipation unit 162 overlaps and comes into contact with the entire first heat dissipation unit 161. Accordingly, heat generated from the semiconductor chip 140 may be transferred to the second heat dissipation unit 162 through the first heat dissipation unit 161 to be diffused and dissipated through a large area.

The second heat dissipation unit 162 may be located to overlap the semiconductor chip 140 and the first heat dissipation unit 161. Specifically, the second heat dissipation unit 162 may cover the semiconductor chip 140 and the first heat dissipation unit 161. In particular, since the second heat dissipation unit 162 comes into contact with the first heat dissipation unit 161 on the first heat dissipation unit 161 and has a larger area than the first heat dissipation unit 161 in a plan view, the second heat dissipation unit 162 may effectively dissipate the heat generated from the semiconductor chip 140 and diffused through the first heat dissipation unit 161 to the outside.

The second heat dissipation unit 162 may comprise a metal. Accordingly, the second heat dissipation unit 162 may protect the semiconductor chip 140 and the wiring unit 120 from physical interference by an external device, and may shield EMI to protect the semiconductor chip 140.

The second heat dissipation unit 162 may have a shape corresponding to the semiconductor chip 140 mounted on the base film 110 and the wiring unit 120. Specifically, as shown in FIG. 5, the second heat dissipation unit 162 may have a shape corresponding to the shape in which the base film 110, the wiring unit 120, the semiconductor chip 140 mounted on the wiring unit 120, the first protection unit 150 which supports the semiconductor chip 140, the first heat dissipation unit 161 which covers the semiconductor chip 140, and the potting resin unit 170 are stacked. Accordingly, the second heat dissipation unit 162 may protect the wiring unit 120 and the semiconductor chip 140 with a minimum volume.

A chip on film package according to one embodiment of the present disclosure can shield electromagnetic interference (EMI) and prevent damage to a semiconductor chip by an external impact The chip on film package according to one embodiment of the present disclosure can protect a semiconductor chip and a wiring from external moisture and dust.

Further, the chip on film package according to one embodiment of the present disclosure can effectively dissipate heat generated from the semiconductor chip mounted on a chip on film package to prevent a malfunction of the semiconductor chip by heat generation.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

Therefore, the above-described embodiments should be understood to be exemplary and not limiting in every aspect. The scope of the present disclosure will be defined by the following claims rather than the above-detailed description, and all changes and modifications derived from the meaning and the scope of the claims and equivalents thereof should be understood as being included in the scope of the present disclosure.

What is claimed is:

1. A chip on film package comprising:
   a base film;
   a wiring unit located on the base film;
   a semiconductor chip mounted on the wiring unit;
   a first heat dissipation unit configured to come into contact with an upper surface of the semiconductor chip;
   a second heat dissipation unit configured to come into contact with the first heat dissipation unit, and comprise a metal; and
   an adhesive unit configured to attach the base film on which the wiring unit is located and the semiconductor chip is mounted to the second heat dissipation unit with the first heat dissipation unit therebetween,
   wherein the first heat dissipation unit is configured to be in contact with the adhesive unit via a side surface of the semiconductor chip.

2. The chip on film package of claim 1, wherein the first heat dissipation unit includes a thermal interface material (TIM).

3. The chip on film package of claim 1, wherein the second heat dissipation unit has a shape corresponding to the semiconductor chip mounted on the base film and the wiring unit.

4. The chip on film package of claim 1, wherein the first heat dissipation unit has a larger area than the semiconductor chip in a plan view.

5. The chip on film package of claim 1, wherein the second heat dissipation unit has a larger area than the first heat dissipation unit and the semiconductor chip in a plan view.

6. The chip on film package of claim 1, wherein the first heat dissipation unit and the second heat dissipation unit overlap at least portions of the wiring unit.

7. The chip on film package of claim 1, wherein:

the first heat dissipation unit overlaps at least a portion of the wiring unit; and the second heat dissipation unit overlaps the wiring unit entirely.

8. The chip on film package of claim 1, further comprising a first protection unit located between the wiring unit and the semiconductor chip to support the semiconductor chip.

9. The chip on film package of claim 8, wherein:

the semiconductor chip is connected to the wiring unit through a bump; and the first protection unit has the same thickness as the bump.

10. The chip on film package of claim 8, wherein the first protection unit includes a surface insulating material.

11. The chip on film package of claim 8, wherein the adhesive unit has a shape surrounding the semiconductor chip and the first heat dissipation unit in a plan view.

12. The chip on film package of claim 1, further comprising a potting resin layer configured to fill a space between the first heat dissipation unit and the side surface of the semiconductor chip.

13. The chip on film package of claim 1, further comprising a second protection unit located on the second heat dissipation unit and comprising an insulating material.

14. A display device comprising a chip on film package electrically connected to a display panel, wherein the chip on film package includes:

a base film;

a wiring unit located on the base film;

a semiconductor chip mounted on the wiring unit;

a first heat dissipation unit configured to come into contact with an upper surface of the semiconductor chip;

a second heat dissipation unit configured to come into contact with the first heat dissipation unit, and comprising a metal; and an adhesive unit configured to attach the base film on which the wiring unit is located and the semiconductor chip is mounted to the second heat dissipation unit with the first heat dissipation unit therebetween, wherein the first heat dissipation unit is configured to be in contact with the adhesive unit via a side surface of the semiconductor chip.

15. The display device of claim 14, wherein the first heat dissipation unit includes a thermal interface material (TIM).

16. The display device of claim 14, wherein the second heat dissipation unit has a shape corresponding to the semiconductor chip mounted on the base film and the wiring unit.

17. The display device of claim 14, wherein the first heat dissipation unit and the second heat dissipation unit have larger areas than semiconductor chip in a plan view.

18. The display device of claim 14, wherein the first heat dissipation unit and the second heat dissipation unit overlap at least portions of the wiring unit.

19. The display device of claim 14, wherein:

the first heat dissipation unit overlaps at least a portion of the wiring unit; and the second heat dissipation unit overlaps the wiring unit entirely.

* * * * *